(12) United States Patent
Suzuki et al.

(10) Patent No.: US 6,501,108 B1
(45) Date of Patent: Dec. 31, 2002

(54) SEMICONDUCTOR INTEGRATED CIRCUIT

(75) Inventors: Kenji Suzuki, Kanagawa (JP); Yoshinori Ueno, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/616,538

(22) Filed: Jul. 14, 2000

(30) Foreign Application Priority Data

Jul. 16, 1999 (JP) .......................................... 11-203453

(51) Int. Cl.[7] .............................................. H01L 27/10
(52) U.S. Cl. ........................ 257/210; 438/128; 438/129
(58) Field of Search ................................ 257/204, 206, 257/210, 211, 207, 208, 773; 438/666, 652, 128, 129

(56) References Cited

U.S. PATENT DOCUMENTS

| | | | | |
|---|---|---|---|---|
| 5,308,781 A | * | 5/1994 | Ando et al. ..................... 437/48 |
| 5,323,045 A | * | 6/1994 | Murai ........................ 257/380 |
| 5,705,847 A | * | 1/1998 | Kashiwa et al. ............ 257/478 |
| 2002/0008263 A1 | * | 1/2002 | Hirano et al. ............... 257/296 |

* cited by examiner

Primary Examiner—Phat X. Cao
Assistant Examiner—Thao X. Le
(74) Attorney, Agent, or Firm—Choat, Hall & Stewart

(57) ABSTRACT

A semiconductor element wherein only one of two mutually adjacent electrodes has a split pattern that is formed on the same layer as the other electrode. The split electrode is connected to a wiring layer provided on a separate layer. When the semiconductor element is a MOSFET, the mutually adjacent electrodes are provided on a source diffusion layer and a drain diffusion layer. Specifically, they serve as a source electrode and a drain electrode, respectively. The split electrode is connected to the source diffusion layer or drain diffusion layer through a single contact hole. This allows the parasitic capacitance in the semiconductor element region to be easily reduced even when the semiconductor element, such as a MOSFET, which comprises the semiconductor integrated circuit is miniaturized.

10 Claims, 9 Drawing Sheets

SEMICONDUCTOR INTEGRATED CIRCUIT

BACKGROUND OF THE INVENTION

1. Technical Field of the Invention

The present invention relates to a semiconductor integrated circuit, and particularly it relates to the structure of a connecting portion for an insulated gate field effect transistor of a semiconductor integrated circuit.

2. Description of the Related Art

Semiconductor elements such as insulated gate field effect transistors (hereunder, MOSFETS) in semiconductor integrated circuits are miniaturized or highly densified in order to achieve higher integration and higher speed of semiconductor integrated circuits. Multilayer wiring is also employed to achieve higher densification of semiconductor integrated circuits.

The reduction of gate lengths occurring with miniaturization of MOSFETs has led to increased driving power for active elements, and accelerated speed for semiconductor integrated circuits. However, the parasitic capacitance is also increased, constituting a major hindrance to higher speeds of semiconductor integrated circuits. A well-known instance is increased parasitic capacitance occurring between wiring layers connecting a plurality of semiconductor elements, which results in reduced signal transmission speed and crosstalk between wiring layers (the phenomenon of signal noise between adjacent wiring layers) due to such parasitic capacitance. In the case of semiconductor elements such as MOSFETs with a microlevel structure, the increase in parasitic capacitance in the MOSFET is considerable.

The structure of a conventional MOSFET will now be explained with reference to the attached drawings. FIG. 1 is a plan view of an inverter with a CMOS structure, and FIG. 2 is a schematic view of a cross-section of FIG. 11 through line I–I.

As shown in FIG. 1, there are formed a P-channel MOSFET 101 serving as the inverter loader and an N-channel MOSFET 102 serving as the inverter driver. The P-channel MOSFET 101 comprises a gate electrode 103, and a source diffusion layer 104 (104a) and drain diffusion layer 105 sandwiching the gate electrode 103. Here, the source diffusion layer 104 (104a) is connected to a source electrode 107 through a plurality of source contact holes 106, and the drain diffusion layer 105 is likewise connected to a drain electrode 109 through a plurality of drain contact holes 108. Similarly, the N-channel MOSFET 102 comprises a gate electrode 103, and a source diffusion layer 110 (110a) and drain diffusion layer 111 sandwiching the gate electrode 103. The source diffusion layer 110 (110a) is connected to a source electrode 113 through source contact holes 112, and the drain diffusion layer 111 is likewise connected to a drain electrode 115 through drain contact holes 114.

The drain electrodes 109 and 115 of the P-channel MOSFET 101 and the N-channel MOSFET 102 are thus both connected to the wiring layer 116 via throughholes (not illustrated). Also, the source electrode 107 of the P-channel MOSFET 101 is connected to power source wiring (not illustrated) while the source electrode 113 of the N-channel MOSFET 102 is connected to GND wiring (not illustrated).

The cross-section will now be explained with reference to FIG. 2. As shown in FIG. 2, the gate electrode 103 is formed on the surface of a semiconductor board 117 via source diffusion layers 104 and 104a and a gate insulating film 118. The source diffusion layers 104 and 104a are each connected to the source electrode 107 through a source plug 119, and the drain diffusion layer 105 is connected to the drain electrode 109 through a drain plug 120. The drain electrode 109 is also connected to the wiring layer 116 through a throughhole plug 121. Here, the source plug 119 and drain plug 120 are both composed of semiconductors filling the contact holes. Similarly, the throughhole plug is made by a semiconductor filling the throughhole.

When a MOSFET of this type of inverter is miniaturized, the distance X between the source electrode 107 and the drain electrode 109 and the distance Y between the gate electrode 103 and the drain plug 120 are both shortened.

According to the conventional technique described above, it is impossible to avoid the problem of parasitic capacitance mentioned above. This problem of parasitic capacitance will now be explained in detail with reference to FIG. 2 through FIG. 4.

FIG. 3 shows the distance X between the source electrode 107 and the drain electrode 109 on the horizontal axis, and the parasitic capacitance value per unit length of the drain electrode 109 on the vertical axis. Here, the interlayer insulating film between the source electrode and drain electrode is a silicon oxide film. As clearly seen in FIG. 3, a smaller distance X results in a larger parasitic capacitance value. It is seen that when the distance X between the source electrode and drain electrode is below 1 $\mu$m, a particularly notable increase in the parasitic capacitance value occurs.

FIG. 4 shows the distance Y between the gate electrode 103 and the drain plug 120 (contact hole) on the horizontal axis and the parasitic capacitance value per unit length of the gate electrode on the vertical axis. As seen in FIG. 4, a smaller distance Y results in a larger parasitic capacitance value. In this case, the increase in the parasitic capacitance value is particularly notable when the distance Y is below 0.2 $\mu$m.

Thus, the increase in parasitic capacitance in a MOSFET region is considerable in the case of miniaturization of the MOSFET structure accompanying high integration or high speed modification of the semiconductor integrated circuit. This problem becomes more notable when the design dimensions of the semiconductor integrated circuit are reduced.

SUMMARY OF THE INVENTION

It is an object of the present invention to provide a semiconductor integrated circuit in which the parasitic capacitance of the semiconductor element region can be easily reduced even when the semiconductor element of the semiconductor integrated circuit, and particularly a MOSFET, is miniaturized.

A semiconductor integrated circuit according to the present invention comprises: a semiconductor element having electrodes and a wiring layer formed on a separate layer from said electrodes. Only one of two mutually adjacent electrodes of the semiconductor element is divided into a plurality of portions that are formed on the same layer as the other electrode, and said divided parts are connected to said wiring layer.

When the semiconductor element is a MOSFET, the mutually adjacent electrodes are formed on a source diffusion layer and a drain diffusion layer. That is, they serve as the source electrode and drain electrode, respectively. The divided portions (split electrodes) are connected to the source diffusion layer or drain diffusion layer through a single contact hole. A silicide layer is also formed on the surface of the source diffusion layer or drain diffusion layer.

The electrodes and the wiring layers may be made of the same type of metal material, a candidate metal material being an aluminum-based metal film. Alternatively, the electrodes and the wiring layers may be formed of different metal materials, with the electrodes formed of an aluminum-based metal film and the wiring layers formed of a tungsten film.

Drain electrodes of a P-channel MOSFET and an N-channel MOSFET which constitute an inverter may be formed in a split manner. Namely, the drain electrode may be divided into a plurality of portions.

By thus dividing or splitting one of the electrodes constituting the semiconductor element, it is possible to reduce the parasitic capacitance produced between the mutually adjacent electrodes. When the semiconductor element is a MOSFET, it is also possible to reduce the parasitic capacitance produced between the gate electrode and the contact plug connecting the source or drain diffusion layer and the electrode. In addition, the parasitic capacitance is reduced and the operating speed of the semiconductor integrated circuit is improved. This effect is even more notable with the semiconductor element is miniaturized.

DETAILED DESCRIPTION OF THE PREFERRED EMBODIMENTS

Figure 5:
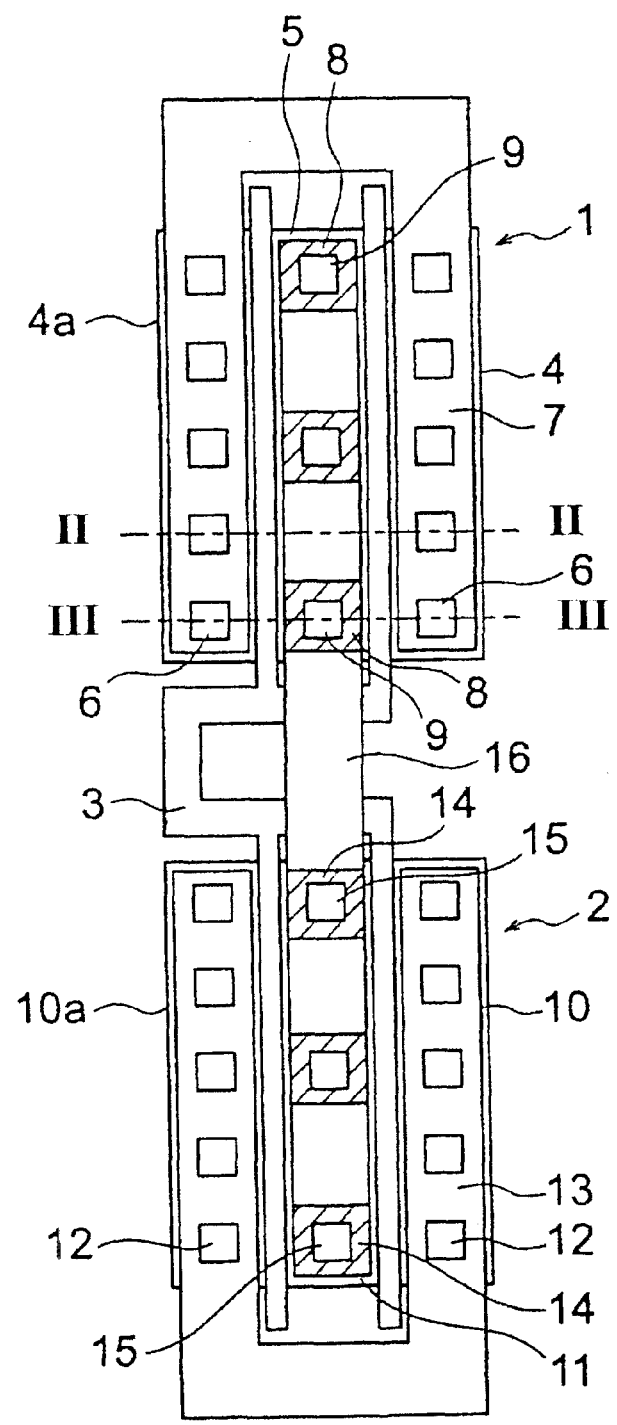
FIG. 5 is a plan view of an inverter for explanation of a first embodiment of the invention.
Figure 6A:
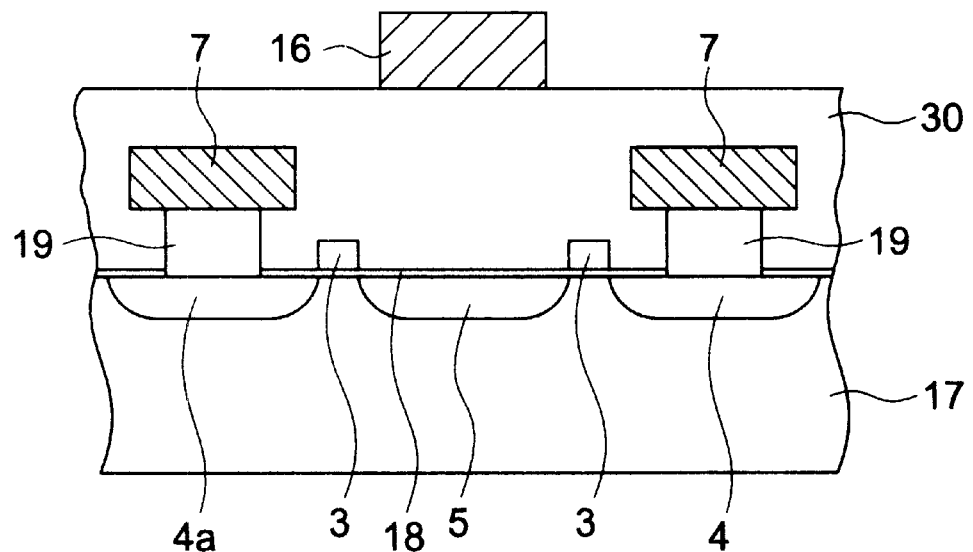
FIGS. 6A and 6B are schematic cross-sectional views for explanation of a first embodiment of the invention.
Figure 6B:
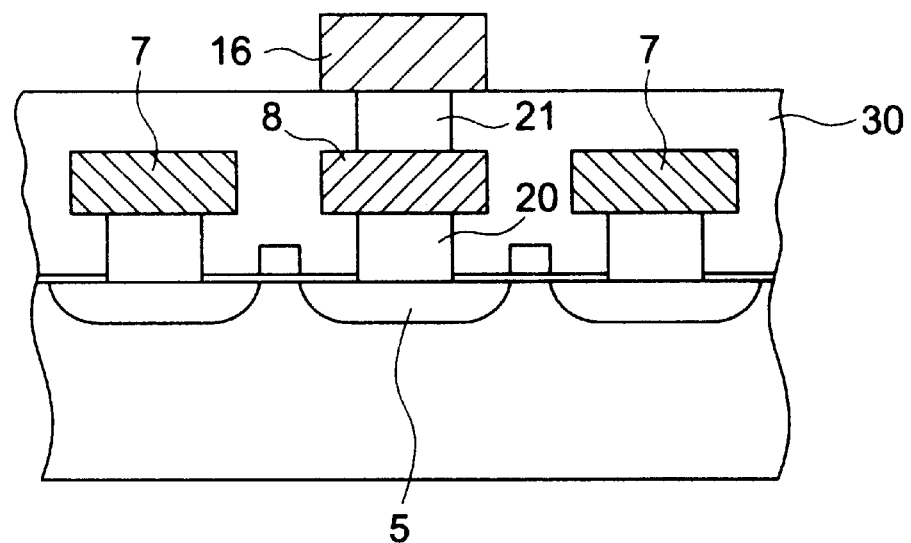

A first embodiment of the invention will now be explained with reference to FIG. 5 and to FIGS. 6A and 6B. FIG. 5 is a plan view of an inverter constructed with a CMOS. FIG. 6A is a cross-sectional view of FIG. 5 along line II-II, and FIG. 6B is a cross-sectional view of FIG. 5 long line III-III, both shown schematically.

As shown in FIG. 5, there are formed a P-channel MOSFET 1 serving as the inverter loader and an N-channel MOSFET 2 serving as the inverter driver. The P-channel MOSFET 1 comprises a gate electrode 3, and a source diffusion layer 4 (4a) and drain diffusion layer 5 sandwiching the gate electrode 3. A silicide layer (not illustrated) is formed on these diffusion layers. Also, the source diffusion layer 4 (4a) is connected to a source electrode 7 through a plurality of source contact holes 6.

It is a feature of the present invention that a drain electrode 8 is divided into a plurality of portions formed on the drain diffusion layer 5. The divided or split drain electrode 8 is a drain electrode split into a small pattern. A drain contact hole 9 is provided under the split drain electrode 8, and the split drain electrode 8 is connected to the silicide layer on the drain diffusion layer 5 via the drain contact hole 9.

As shown in FIG. 5, the N-channel MOSFET 2 likewise comprises a gate electrode 3, and a source diffusion layer 10 (10a) and drain diffusion layer 11 sandwiching the gate electrode 3. Also, the source diffusion layer 10 (10a) is connected to a source electrode 13 through source contact holes 12.

Split drain electrodes 14 are also formed in the same manner as described above on the drain diffusion layer 11. A drain contact hole 15 is also provided under each split drain electrode 14, and the split drain electrodes 14 are connected to the silicide layer on the drain diffusion layer 11 via the drain contact holes 15.

The split drain electrodes 8 and 14 of the P-channel MOSFET 1 and the N-channel MOSFET 2 are both connected to the wiring layer 16 through throughholes.

The cross-section will now be explained with reference to FIG. 6A. As shown in FIG. 6A, source diffusion layers 4 and 4a are formed on the surface of a semiconductor board 17, and the gate electrode 3 is formed on the surface of the semiconductor board 17 via a gate insulating film 18. The source diffusion layers 4 and 4a are each connected to the source electrode via a source plug 19. Here, each source plug 19 is formed by a semiconductor filling the contact holes 6.

As shown in FIG. 6A, absolutely no split drain electrode 8 is formed on the drain diffusion layer 5 in this region. Thus, the wiring layer 16 explained for FIG. 5 is formed on the drain diffusion layer 5 via an interlayer insulating film 30.

Figure 1:
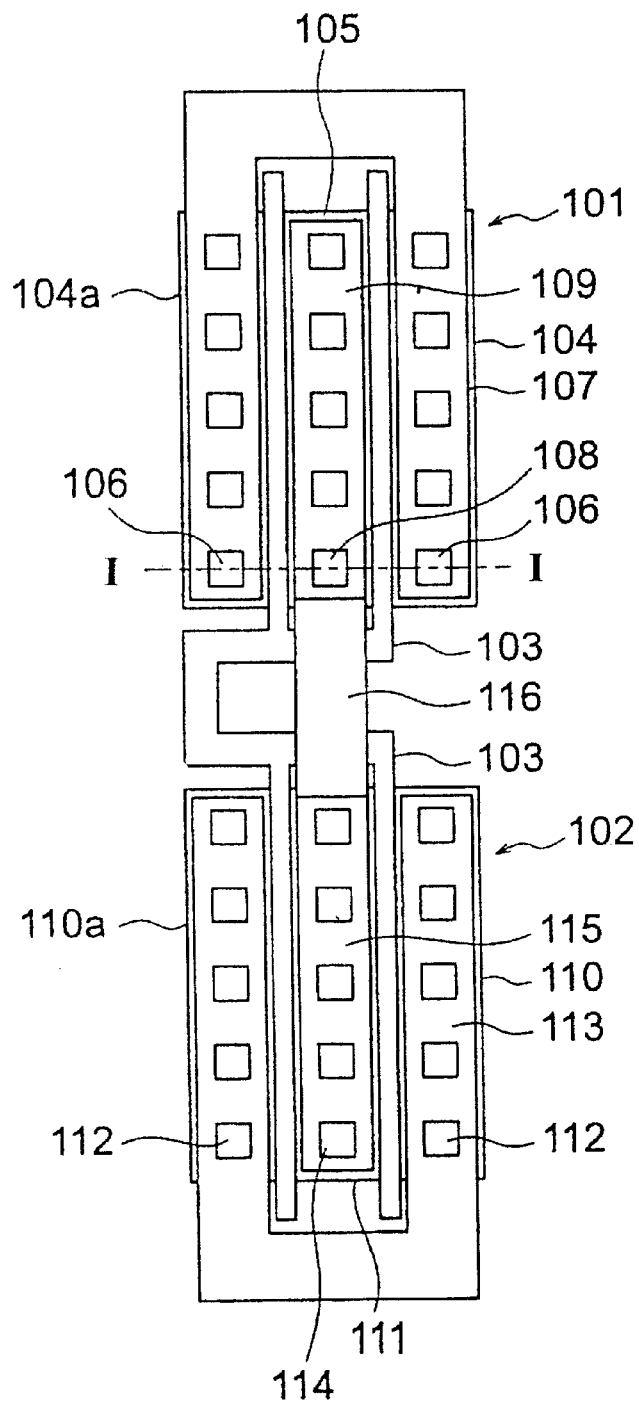
FIG. 1 is a plan view of an inverter for explanation of the prior art.

In contrast, as shown in FIG. 6B, the split drain electrode 8 is formed on the same layer as the source electrode 7 in the cross-section of FIG. 1 along line I-I. This split drain electrode 8 is connected to the drain diffusion layer 5 via a drain plug 20. Though not illustrated here, a silicide layer is formed on the surface of the drain diffusion layer 5. In addition, a throughhole plug 21 is formed on the split drain electrode 8 and the split drain electrode 8 is connected to the wiring layer 16 via the throughhole plug 21.

In this embodiment, the source electrodes 7 and 13 and the split drain electrodes 8 and 14 are formed of a first aluminum-based metal layer, and the wiring layer 16 is formed of a second aluminum-based metal layer. Alternatively, the source electrodes 7 and 13 and the split drain electrodes 8 and 14 may be formed of an aluminum-based metal layer and the wiring layer 16 may be formed of a different material such as tungsten.

According to the invention, a split drain electrode is formed on the drain diffusion layer 5, as explained above. Consequently, the parasitic capacitance between the source electrodes and drain electrodes and the parasitic capacitance between the gate electrodes and drain plugs, explained above in the prior art, are both reduced. These effects will be explained below.

Figure 7:
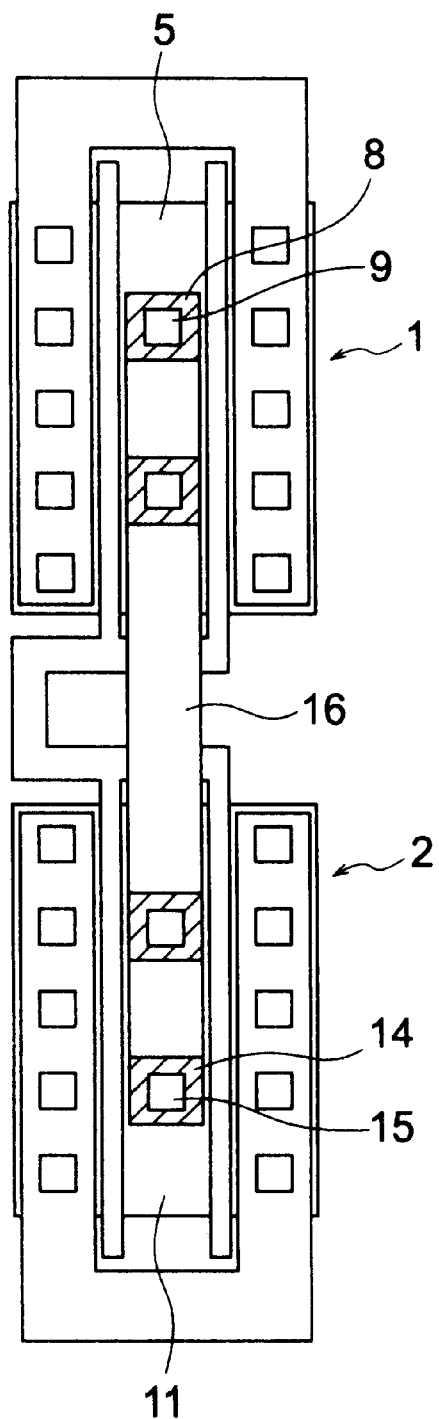
FIG. 7 is a plan view of an inverter for explanation of a second embodiment of the invention.

A second embodiment of the invention will now be explained with reference to FIG. 7. The second embodiment shown in FIG. 7 differs from the first embodiment in that fewer split drain electrodes are formed, but is the same as the first embodiment in its other aspects. The second embodiment will be explained with focus on its aspects that are different from the first embodiment.

As shown in FIGS. 6A and 6B, split drain electrodes 8 are formed on the drain diffusion layer 5 of the P-channel MOSFET 1, in the same manner as explained for FIG. 5. However, the number of split drain electrodes in this case is less than for the first embodiment. In addition, drain contact holes 9 are provided under each split drain electrode 8. Similarly, split drain electrodes 14 are formed on the drain diffusion layer 11 of the N-channel MOSFET 2. The number of split drain electrodes in this case is also less than for the first embodiment. In addition, drain contact holes 15 are formed under each split drain electrode 14.

According to the second embodiment, the number of split drain electrodes is less than for the first embodiment. The parasitic capacitance described above is therefore further reduced.

Figure 8:
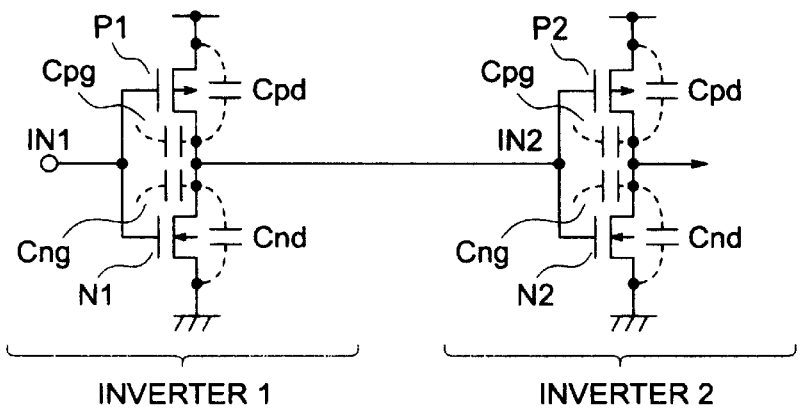
FIG. 8 is an equivalent circuit diagram of an inverter chain for explanation of the effect of the invention.

An oscillation circuit (a ring oscillator) was therefore fabricated and studied to examine the effects of the aforementioned first and second embodiments of the invention. The effects will be explained with reference to FIG. 8 and FIG. 9. FIG. 8 is an equivalent circuit diagram of a portion of an inverter chain, inverter 1 and inverter 2, in a ring oscillator.

Figure 2:
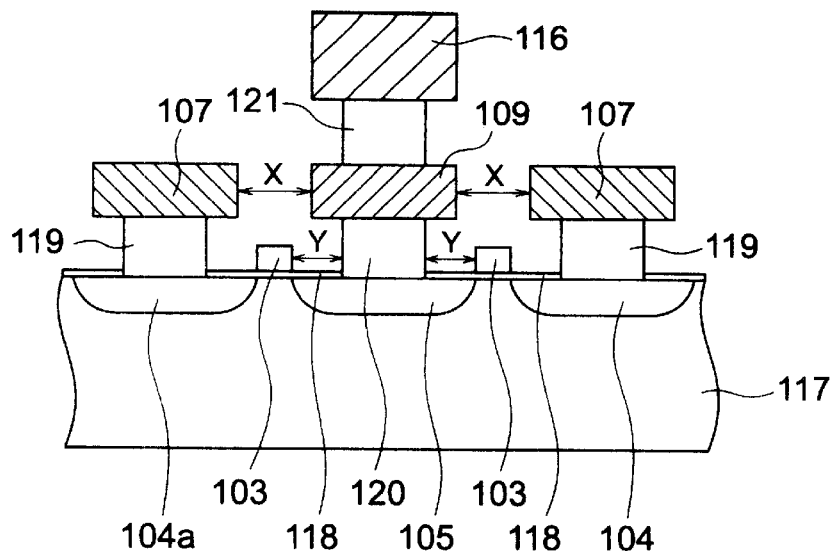
FIG. 2 is a schematic cross-sectional view for explanation of the present invention.

The design standard for the MOSFET used in FIG. 8 is 0.3 $\mu$m. The structure is shown in FIG. 5 through FIG. 7 or in FIG. 1 and FIG. 2. Here, the gate length and gate width of the P-channel MOSFETs P1, P2 are 0.32 $\mu$m and 10 $\mu$m, respectively, and the thickness of the gate electrode film is 6 nm. Similarly, the gate length and gate width of the N-channel MOSFETs N1, N2 are 0.3 $\mu$m and 10 $\mu$m, respectively, and the thickness of the gate electrode film is 6 nm. The source electrodes and split drain electrodes are formed by a first aluminum alloy film with a thickness of 0.5 $\mu$m, and the wiring layer is formed of a second aluminum alloy film.

As shown in FIG. 8, a parasitic capacitance Cpd is formed between each of the source electrodes and drain electrodes (split drain electrodes) of the P-channel MOSFETs P1 and P2. Similarly, a parasitic capacitance Cnd is formed between each of the source electrodes and drain electrodes (split drain electrodes) of the N-channel MOSFETs N1 and N2.

Also, a parasitic capacitance Cpg is formed between each of the gate electrodes and drain plugs of the P-channel MOSFETs P1 and P2, while a parasitic capacitance Cng is formed between each of the gate electrodes and drain plugs of the N-channel MOSFETs Ni and N2. Here, an input terminal IN1 is connected to the gate electrode of the inverter 1, and the output of the inverter 1 passes through the aforementioned wiring layer for connection to the input terminal IN2 of the inverter 2.

If the total parasitic capacitance according to the prior art is defined as 1 (parasitic capacitance Cpd+parasitic capacitance Cnd+parasitic capacitance Cpg+parasitic capacitance Cng), the total parasitic capacitance for the first embodiment described above is reduced by about 12%. Similarly, the total parasitic capacitance for the second embodiment is reduced by 27%.

Figure 9:
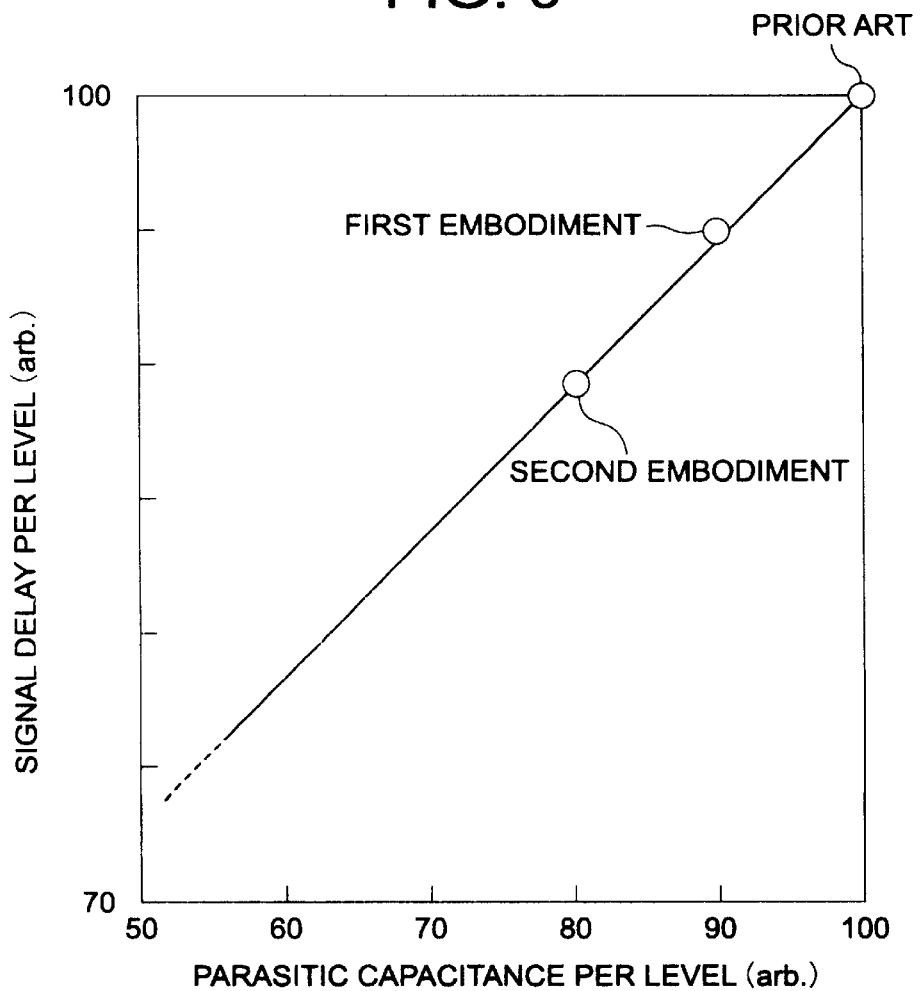
FIG. 9 is a graph showing signal transmission delay for explanation of the effect of the invention.

The present inventors determined the signal delay with a ring oscillator constructed with 23 levels of such inverters. The results are shown in FIG. 9. Here, the parasitic capacitance per level of inverter is shown on the horizontal axis. On this horizontal axis, 100 indicates the parasitic capacitance per level of inverter according to the prior art. The signal delay per level of inverter is shown on the vertical axis, with the delay according to the prior art indicated by 100.

As seen in FIG. 9 for the first embodiment, the signal delay is reduced by about 10% compared to the prior art, so that signal transmission is faster. Similarly, with the second embodiment the signal delay is reduced by about 20% compared to the prior art.

Figure 3:
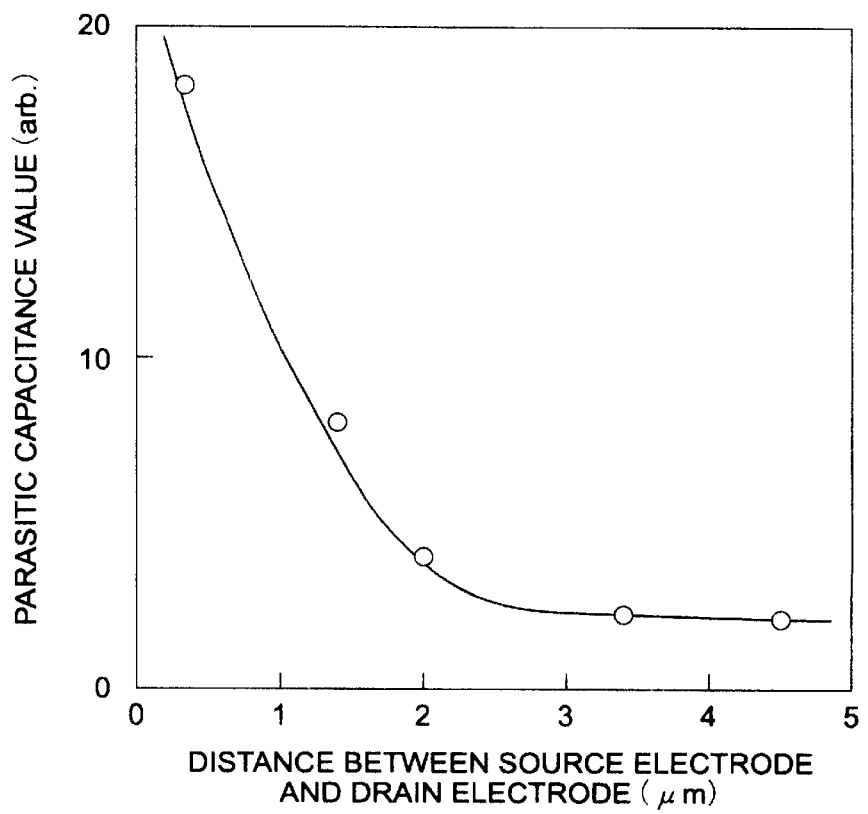
FIG. 3 is a graph for explanation of the problems of the prior art.
Figure 4:
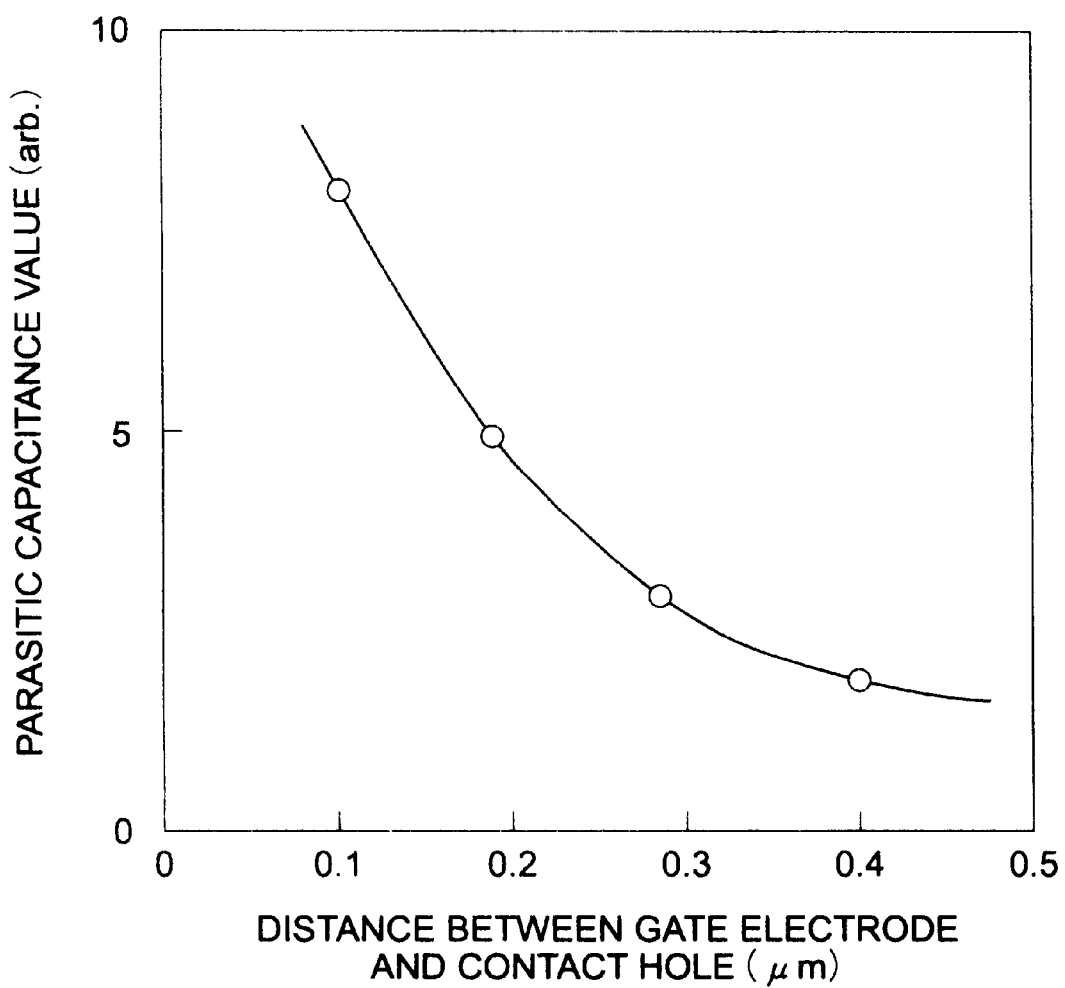
FIG. 4 is a graph for explanation of the problems of the prior art.

Fabrication of ring oscillators for verification of the effect of the invention is currently accomplished through stable steps. With future miniaturization of semiconductor element design standards to about 0.1 $\mu$m, the effect of the invention will become even more notable. The effect of the invention with such miniaturization can be easily inferred from the explanation based on FIG. 3 and FIG. 4 regarding the prior art.

Figure 10:
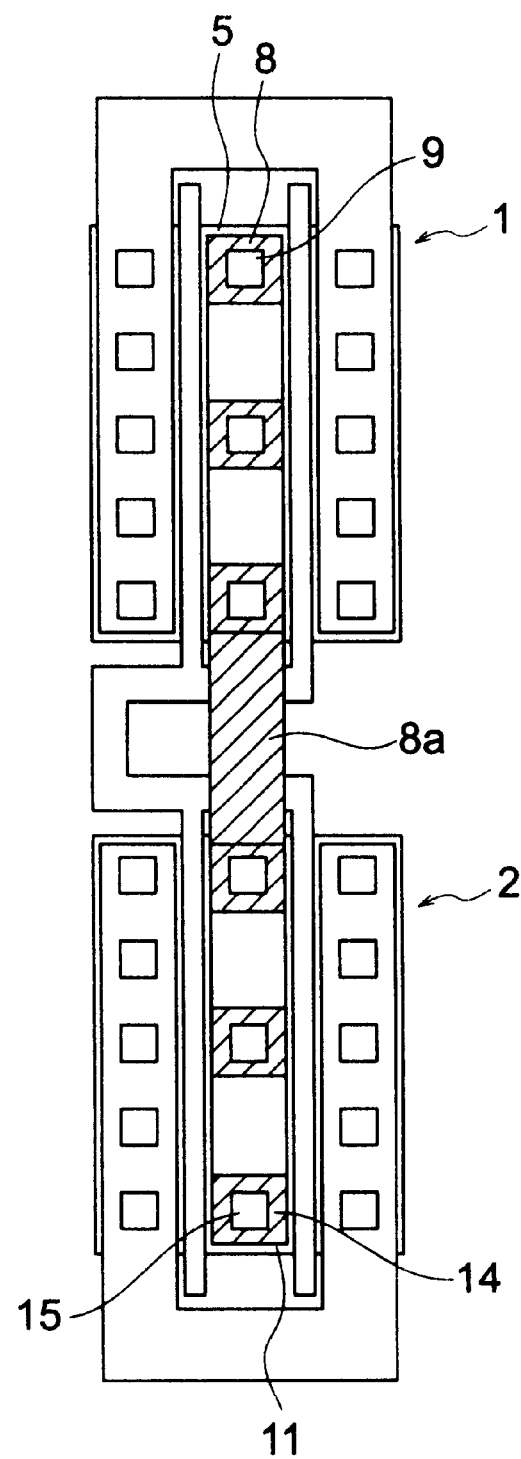
FIG. 10 is a plan view of an inverter for explanation of a third embodiment of the invention.

A third embodiment and a fourth embodiment of the invention will now be explained with reference to FIG. 10 and FIG. 11. The third and fourth embodiments are basically the same as the first embodiment. They will be explained with focus on their differences from the first embodiment. According to the third embodiment of the invention, as shown in FIG. 10, split drain electrodes 8 are formed on the drain diffusion layer 5 of a P-channel MOSFET 1. Drain contact holes 9 are also provided under each of the split drain electrodes 8. Similarly, split drain electrodes 14 are formed on the drain diffusion layer 11 of an N-channel MOSFET 2, and drain contact holes 15 are provided under each split drain electrode 14. According to this embodiment, the split drain electrode 8a performs the role of the wiring layer explained in the first embodiment. This construction facilitates high density wiring since it allows multilayer wiring to be formed in this region.

According to the first through third embodiments, the throughholes connecting the split drain electrodes and the wiring layer have been formed on the drain contact holes.

Figure 11:
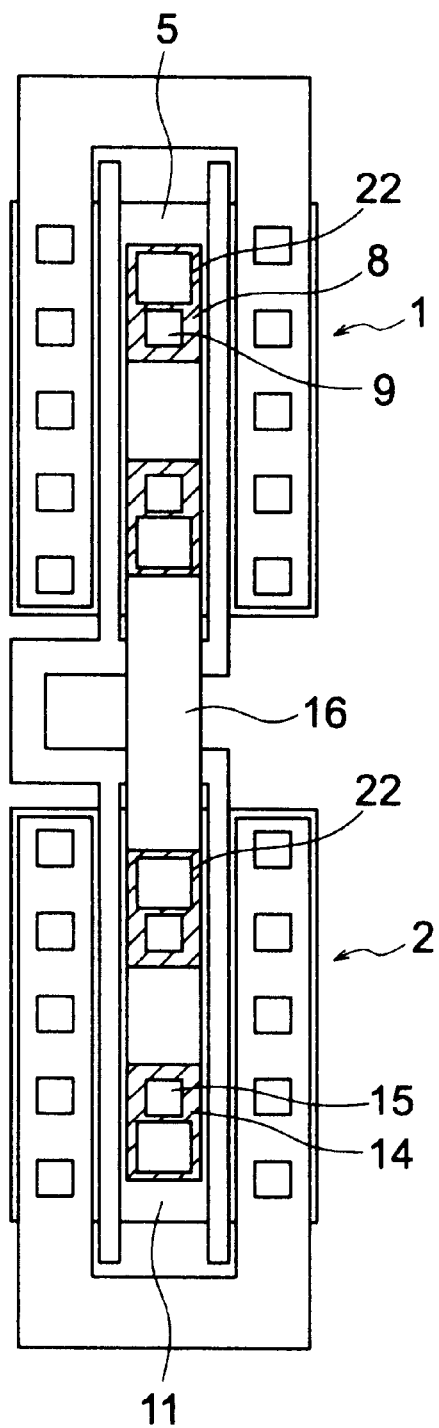
FIG. 11 is a plan view of an inverter for explanation of a fourth embodiment of the invention.

According to the fourth embodiment of the invention, as shown in FIG. 11, the throughholes 22 are provided separately from the drain contact holes 9. The rest of the construction is roughly the same as the second embodiment.

For these embodiments, the semiconductor elements of the semiconductor integrated circuits have been explained as MOSFETs. However, the invention is not limited to this, and may be applied in the same manner for diodes, resistors, capacitors and the like.

In the case of these types of semiconductor elements, one of the mutually adjacent electrodes of the semiconductor element is split. The split electrode is also connected to the wiring layer formed on another layer.

According to the invention, as explained above, only one of the two mutually adjacent electrodes of the semiconductor element has a split pattern that is formed on the same layer as the other electrode. The split electrode is connected to a wiring layer formed on a separate layer. When the semiconductor element is a MOSFET, the mutually adjacent electrodes are formed on a source diffusion layer and a drain diffusion layer. That is, they serve as the source electrode and drain electrode, respectively. The split electrode is connected to the source diffusion layer or drain diffusion layer through a single contact hole.

By thus splitting one of the electrodes of the semiconductor element, it is possible to drastically reduce the parasitic capacitance produced between mutually adjacent electrodes. When the semiconductor element is a MOSFET, it is also possible to reduce the parasitic capacitance produced between the gate electrode and the contact plug connecting the source or drain diffusion layer and the electrode.

Consequently, the parasitic capacitance in the region of the semiconductor element is reduced and the operating speed of the semiconductor integrated circuit is improved. This effect is even more notable with miniaturization of the design dimensions of the semiconductor integrated circuit.

What is claimed is:

1. A semiconductor integrated circuit comprising:

a semiconductor element having at least two electrodes and a wiring layer formed on a separate layer from said electrodes, only one of two mutually adjacent electrodes of the semiconductor element being divided into a plurality of disconnected portions to provide one of a discontinuous source electrode and a discontinuous drain electrode that is formed on the same layer as the other electrode, and each of said divided portions being electrically connected to other portions by said wiring layer.

2. A semiconductor integrated circuit according to claim 1, wherein said semiconductor element is an insulated gate field effect transistor, and said mutually adjacent electrodes are formed with one electrode on a source diffusion layer and with the other electrode on a drain diffusion layer.

3. A semiconductor integrated circuit according to claim 2, wherein said divided electrode is connected to said source diffusion layer or drain diffusion layer through a single contact hole.

4. A semiconductor integrated circuit according to claim 2, further comprising silicide layers formed on the surface of said source diffusion layer and drain diffusion layer.

5. A semiconductor integrated circuit according to claim 3, further comprising silicide layers formed on the surface of said source diffusion layer and drain diffusion layer.

6. A semiconductor integrated circuit according to claim 1, wherein said electrodes and said wiring layer formed on said separate layer are made of the same metal material.

7. A semiconductor integrated circuit according to claim 6, wherein said metal material is one of an aluminum alloy and an aluminum metal film.

8. A semiconductor integrated circuit according to claim 1, wherein said electrodes and said wiring layer formed on said separate layer are made of different metal materials.

9. A semiconductor integrated circuit according to claim 8, wherein said electrodes are formed of one of an aluminum alloy and an aluminum metal film and said wiring layer formed on said separate layer is formed of a tungsten film.

10. A semiconductor integrated circuit according to claim 2, wherein said one of two mutually adjacent electrodes which is divided into a plurality of portions comprise drain electrodes of a P-channel MOSFET and an N-channel MOSFET which constitute an inverter.

* * * * *